US008965776B2

(12) United States Patent
Blakey et al.

(10) Patent No.: US 8,965,776 B2
(45) Date of Patent: Feb. 24, 2015

(54) ITERATIVE FORWARD ERROR CORRECTION (FEC) ON SEGMENTED WORDS USING A SOFT-METRIC ARITHMETIC SCHEME

(75) Inventors: Stanley H. Blakey, Kanata (CA); Alexander Kaganov, Toronto (CA); Yuejian Wu, Ottawa (CA); Sandy Thomson, Ottawa (CA)

(73) Assignee: Infinera Corporation, Sunnyvale, CA (US)

( * ) Notice: Subject to any disclaimer, the term of this patent is extended or adjusted under 35 U.S.C. 154(b) by 437 days.

(21) Appl. No.: 13/435,913

(22) Filed: Mar. 30, 2012

(65) Prior Publication Data

US 2013/0262084 A1    Oct. 3, 2013

(51) Int. Cl.
*H04L 1/00*   (2006.01)
*H03M 13/45*  (2006.01)

(52) U.S. Cl.
CPC ............ *H04L 1/005* (2013.01); *H03M 13/451* (2013.01)
USPC ........... 704/500; 714/776; 714/759; 714/755; 714/753

(58) Field of Classification Search
CPC ...... H04I 1/005; H03M 13/451; G10L 19/005
USPC ....................................................... 704/500
See application file for complete search history.

(56) References Cited

U.S. PATENT DOCUMENTS

| 5,010,554 | A  | * | 4/1991  | Bechtel et al. ............... | 714/759 |
| 2005/0210358 | A1 | * | 9/2005  | Chouly et al. ............... | 714/753 |
| 2010/0223524 | A1 | * | 9/2010  | Duggan et al. ............... | 714/751 |
| 2012/0297267 | A1 | * | 11/2012 | Chinnici et al. ............. | 714/755 |

OTHER PUBLICATIONS

D. Chase: "A Class of Algorithms for Decoding Block Codes With Channel Measurement Information"; IEEE Transactions on Information Theory, vol. IT-18, No. 1, Jan. 1972, 13 pages.
R. Pyndiah et al.: "Near Optimum Decoding of Product Codes"; Telecom Bretagne, IEEE 1994, 5 pages.
R. Pyndiah: "Near-Optimum Decoding of Product Codes: Block Turbo Codes"; IEEE Transactions on Communications, vol. 46, No. 8, Aug. 1998; 8 pages.
Knuth, "The Art of Computer Programming", Second Edition, vol. 3—Sorting and Searching, Stanford University, 780 pages; 1998.
Lin et al., "Error Control Coding: Fundamentals and Applications", Prentice-Hall Computer Applications in Electrical Engineering Series, 603 pages, 1983.

* cited by examiner

*Primary Examiner* — Vincent P Harper
(74) *Attorney, Agent, or Firm* — Harrity & Harrity LLP; David L. Soltz

(57) ABSTRACT

A system is to receive a word on which to perform error correction; obtain segments, from the word, each segment including a respective subset of samples; update, on a per segment basis, the word based on extrinsic information associated with a previous word; identify sets of least reliable positions (LRPs) associated with the segments; create a subset of LRPs based on a subset of samples within the sets of LRPs; generate candidate words based on the subset of LRPs; identify errors within the word or the candidate words; update, using the extrinsic information, a segment of the word that includes an error; determine distances between the candidate words and the updated word that includes the updated segment; identify best words associated with shortest distances; and perform error correction, on a next word, using other extrinsic information that is based on the best words.

26 Claims, 8 Drawing Sheets

| Cycle 605-1 | Cycle 605-2 | Cycle 605-3 | Cycle 605-4 | ... | Cycle 605-16 | ... | Cycle 605-P |
|---|---|---|---|---|---|---|---|
| R' update Segment 1 | R' update Segment 2 | R' update Segment 3 | R' update Segment 4 | ... | R' update Segment 16 | ... | ... |
|  | LRP Sort Segment 1 | LRP Sort Segment 2 | LRP Sort Segment 3 | ... | ... | LRP Sort Segment 16 | ... |
|  |  | Identify LRPs Segment 1 | Merge LRP Segment 2 | Merge LRP Segment 3 | ... | ... | Merge LRP Segment 16 |

ITERATIVE FORWARD ERROR CORRECTION (FEC) ON SEGMENTED WORDS USING A SOFT-METRIC ARITHMETIC SCHEME

BACKGROUND

In an increasingly networked world, more and more traffic, such as data, voice, and video, is transmitted over public and proprietary networks. The networks use high data rates (e.g., greater than 10 gigabits per second (Gbps)) to transport greater quantities of traffic. Certain types of the networks, such as optical networks, use complex signal processing to achieve the high data rates. The complex signal processing may be performed using forward error correction (FEC) devices that use soft iterative error correction techniques to reduce a quantity of errors, within the traffic, to a level that is specified by the public and proprietary networks. The quantity of bits that are generated, processed, and/or stored while performing soft iterative error correction may increase costs associated with FEC devices that process traffic within the public and proprietary networks.

SUMMARY

According to one implementation, a system may include one or more devices to: receive a word, of a block of words within traffic, on which to perform forward error correction, the word including a group of samples, each of the group of samples including respective encoded bits and respective reliability bits, the respective reliability bits corresponding to a respective level of reliability of the respective encoded bits; obtain, from the word, a group of segments, each segment, of the group of segments, may include a respective subset of samples of the group of samples; and update, on a per segment basis, the word based on first extrinsic information associated with a previously received word of the block of words. The first extrinsic information may modify levels of reliability associated with the group of samples. The one or more devices may also identify sets of least reliable positions (LRPs) associated with the group of segments, each one of the sets of LRPs, corresponding to a respective portion of samples, within each segment, associated with one or more lowest levels of reliability; create a subset of LRPs based on a subset of samples, that correspond to the sets of LRPs, associated with the one or more lowest levels of reliability; and generate candidate words based on different combinations of inverted encoded bits, within the word, that correspond to the LRPs within the subset of LRPs. The one or more devices may further decode the word and the candidate words to identify errors within the word or the candidate words; update one or more segments of the word based on the first extrinsic information, the one or more segments may include one or more of the identified errors; determine, on the per segment basis, distances between the candidate words and the updated word that includes the updated one or more segments; identify two or more best candidate words associated with two or more shortest distances, and perform the forward error correction, on a next word of the block of words, using second extrinsic information that is based on the two or more best candidate words.

According to another implementation, a method may include receiving, from an optical receiver and by a device, a word, of a block of words within traffic, on which to perform forward error correction, the word including encoded bits and sets of reliability bits for identifying a respective level of reliability of each of the encoded bits; updating, by the device, a first segment of the word and a second segment of the word based on first extrinsic information. The first segment may include a first subset of the encoded bits. The second segment may include a second subset of the encoded bits. The first extrinsic information may modify reliability bits associated with the first subset and the second subset. The method may also include identifying, by the device, first least reliable positions (LRPs) within the updated first segment and second LRPs within the updated second segment. The first LRPs may correspond to first bits within the first subset with a lowest level of reliability. The second LRPs may correspond to second bits within the second subset with another lowest level of reliability. The method may further include identifying, by the device, LRPs, within the word, based on a subset of a combination of the first bits and the second bits associated with one or more lowest levels of reliability; generating, by the device, candidate words based on different combinations of inverted encoded bits, within the word, that correspond to the identified LRPs; identifying, by the device, errors within the word or the candidate words; updating, by the device and based on the first extrinsic information, a first encoded bit, within the first segment, in which an error is identified; determining, by the device, first partial distances between the updated first segment and first segments of the candidate words and second partial distances between the second segment and second segments of the candidate words; generating, by the device, second extrinsic information based on two or more best words of the candidate words, the two or more best words corresponding to two or more shortest first partial distances and two or more shortest second partial distances; and processing, by the device, a next word, of the block of words, using the second extrinsic information.

According to a further implementation, a device may include one or more components to receive a word, of a block of words within traffic, on which to perform a forward error correction operation. The word may include a group of samples, where each one of the group of samples may include respective encoded bits and respective reliability bits and the respective reliability bits may correspond to a respective level of reliability of the respective encoded bits. The one or more components may also be to obtain segments from the word, each of the segments including a respective subset of samples of the plurality of samples; modify, on a per segment basis, reliability levels associated with the word based on extrinsic information associated with a previously processed word; identify, on the per segment basis, sets of least reliable positions (LRPs) associated with the segments, where each of the sets of LRPs may correspond to a respective portion, of each subset of samples, associated with lowest levels of reliability; and create a subset of LRPs based on selected samples, of the respective portion of each of the subsets of samples, associated with one or more of the lowest levels of reliability. The one or more components may further be to generate candidate words based on different combinations of inverted encoded bits, within the word, that correspond to the selected samples; decode the word and the candidate words to identify one or more errors within the word or the candidate words; update, using the extrinsic information, a segment of the word based on a determination that the segment includes an error of the one or more errors; and create, on the per segment basis, an updated word. The updated word may include the updated segment and other segments, of the word, associated with the modified reliability levels. The one or more components may also be to: determine, on the per segment basis, distances between the segments of the updated word and segments of selected candidate words; identify, as a best word, one of the selected candidate words associated with a shortest one of the

DETAILED DESCRIPTION

The following detailed description refers to the accompanying drawings. The same reference numbers in different drawings may identify the same or similar elements.

Systems and/or methods, described herein, may allow a forward error correction device (hereinafter referred to as a "FEC device") to perform soft iterative forward error correction on an encoded word, within traffic, by processing the encoded word on a segment-by-segment basis (hereinafter referred to as a "per segment basis"). Each of the segments, of the encoded word, may include a subset of samples associated with the encoded word. The FEC device may process the encoded word on per segment basis, which may reduce a quantity of bits of data that are used and/or stored when performing the soft iterative forward error correction. Reducing the quantity of bits that are used or stored may enable the FEC device to reduce a quantity of hardware components associated with the FEC device, which may reduce costs and/or complexity associated with the FEC device. Additionally, or alternatively, reducing the quantity of bits may enable the FEC device to use available memory to process encoded words with a greater level of sensitivity or range, which may allow a greater quantity of errors to be corrected and/or may reduce a processing time associated with correcting errors.

The FEC device may also, or alternatively, use an expanded range of reliability values, associated with samples within encoded words, that is greater than a range used by a conventional FEC device. Use of the expanded range of reliability values may enable the FEC device to increase a quantity of errors that can be corrected and/or may reduce a processing time and/or cost associated with correcting an error. The FEC device may also, or alternatively, make use of fractional bits when processing encoded words rather than round fractional bits to a discrete value (e.g., 0, +/−, +/−2, etc.) as a conventional FEC device may. Use of fractional bits may enable the FEC device to increase a quantity of errors that can be corrected and/or may reduce a processing time and/or cost associated with correcting an error.

Figure 1:
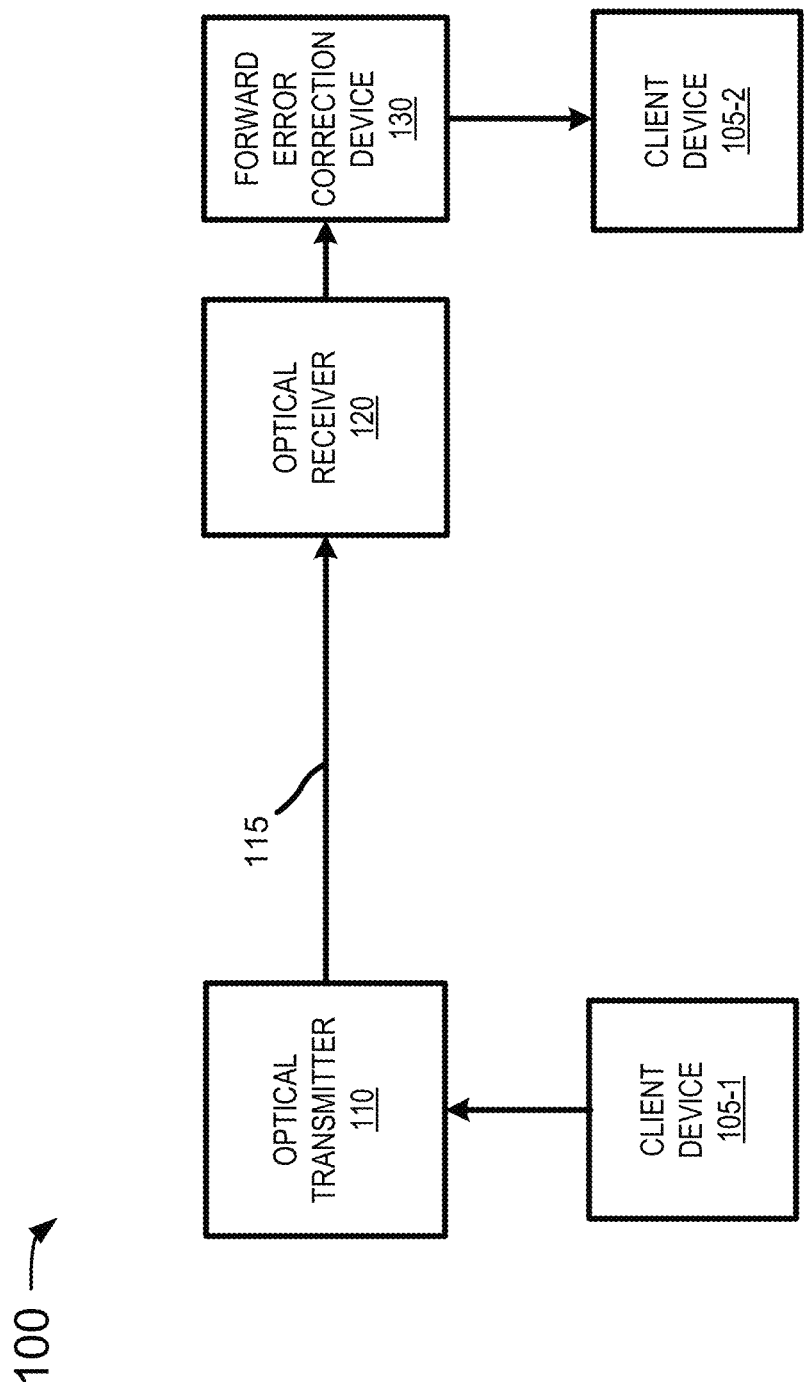
FIG. 1 is a diagram of an example network in which systems and/or methods described herein may be implemented.

FIG. 1 is a diagram of an example network 100 in which systems and/or methods described herein may be implemented. Network 100 may include a pair of client devices 105-1 and 105-2 (hereinafter referred to, in some instances, as "client device 105"), an optical transmitter 110, a link 115, an optical receiver 120, and a forward error correction (FEC) device 130. The number of devices, illustrated in FIG. 1, is provided for explanatory purposes. In practice, there may be additional devices, fewer devices, different devices, or differently arranged devices than illustrated in FIG. 1. Also, in some implementations, one or more of the devices of network 100 may perform one or more functions described as being performed by another one or more of the devices of network 100. For example, functions performed by FEC device 130 could be performed by optical receiver 120 instead of, or in combination with, some other device.

Client device 105 may include a computation and communication device that is capable of communicating with optical transmitter 110, optical receiver 120, and/or FEC device 130. For example, client device 105 may include a radiotelephone, a personal communications system (PCS) terminal (e.g., that may combine a cellular radiotelephone with data processing and data communications capabilities), a personal digital assistant (PDA) (e.g., that can include a radiotelephone, a pager, Internet/intranet access, etc.), a server device, a laptop computer, a tablet computer, a set top box, a digital video recorder (DVR), a personal gaming system, a smart phone, or another type of computation and communication device.

Client device 105-1 may, for example, transmit, to optical transmitter 110, a client signal that includes a stream of packets that carry a payload (e.g., a message, data, video, audio, a document, etc.), associated with client device 105-1. Optical transmitter 110 may provide the client signal to optical receiver 120. Alternatively, or additionally, client device 105-2 may communicate with FEC device 130 to receive the client signal that has been processed, by optical receiver 120 and/or FEC device 130, to detect and/or correct errors within the client signal. Client device 105-2 may receive the client signal directly from FEC device 130 and/or indirectly from FEC device 130, such as via optical receiver 120.

Optical transmitter 110 may include one or more devices that generate and/or transmit an optical signal to optical receiver 120. Optical transmitter 110 may, in an example implementation, include one or more lasers that generate one or more optical signals. Alternatively, or additionally, optical transmitter 110 may include a modulator that modulates the one or more optical signals based on one or more input electrical signals, such as client signals received from client devices 105. In this example, optical transmitter 110 may modulate the optical signals using one or more modulation techniques (e.g., phase modulation, frequency modulation, amplitude modulation, polarization modulation, and/or other modulation techniques).

Alternatively, or additionally, optical transmitter 110 may include an encoding device that encodes payload bits that are included within a client signal received from client device 105-1. Optical transmitter 110 may encode the payload bits using a forward error correction code (e.g., a Bose, Ray-Chaudhuri (BCH) code, and/or some other type of error correction code). Optical transmitter 110 may also, or alternatively, iteratively encode rows and/or columns of payload bits as a block and/or a frame of a fixed quantity of encoded payload bits to be described in greater detail below with respect to FIG. 3. Each encoded row and/or column may include encoded payload bits and error identification and/or correction bits associated with the encoded payload bits within the rows and/or columns.

Alternatively, or additionally, optical transmitter 110 may include a multiplexer to multiplex the modulated optical signals (e.g., using wavelength-division multiplexing (WDM))

into an optical signal, associated with different wavelengths, for transmission to optical receiver 120.

Link 115 may include one or more devices and/or mechanisms to allow an optical signal to be transported to optical receiver 120. Link 115 may, in one example, include one or more optical fibers and/or fiber optic cables that allow the optical signal to be transported from optical transmitter 110 to optical receiver 120.

Optical receiver 120 may include one or more devices that receive, convert, process, amplify, and/or demodulate optical and/or electrical signals in a manner described herein. Optical receiver 120, in one implementation, may include one or more polarization beam splitting (PBS) devices that split the optical signal into one or more optical signals associated with different polarizations (e.g., a transverse magnetic (TM) polarization, a transverse electric (TE) polarization, etc.). Alternatively, or additionally, optical receiver 120 may include a demultiplexer device that demultiplexes a multi-wavelength optical signal (e.g., using wavelength-division demultiplexing techniques), received from optical transmitter 110, into multiple optical signals associated with different wavelengths. Alternatively, or additionally, optical receiver 120 may include one or more demodulators that convert the optical signals into electrical signals on which optical receiver 120 can perform signal processing. Alternatively, or additionally, optical receiver 120 may include an analog-to-digital converter to convert analog signals to digital signals, while preserving enough analog information to allow the reliability of the signal to be estimated.

Optical receiver 120, in one example, may include a signal processing device that processes an electrical signal by inserting reliability bits into a stream of encoded symbols (e.g., that includes encoded payload bits and/or bits associated with error identification and/or correction), included within the electrical signal. Optical receiver 120 may generate one or more reliability bits, associated with each symbol, based on a determination of a respective level of reliability of each encoded payload bit within each symbol. Optical receiver 120 may create a sample for each encoded symbol that includes encoded payload bits, error identification and/or correction bits, and/or the reliability bits.

Optical receiver 120 may, for example, determine an amplitude (e.g., based on a power level, a voltage level, etc.), of an encoded payload bit within a sample. Optical receiver 120 may also, or alternatively, determine that the amplitude is greater than a first threshold (e.g., +1 volt, +3 volts, etc.). When the amplitude is greater than the first threshold, optical receiver 120 may insert, into the sample, reliability bits associated with a first level of reliability (e.g., a first reliability value of +3 or some other first reliability value) for a bit likely to be a logical mark associated with a first value (e.g., a value of 1 or some other first value). The reliability bits may, for example, be encoded in two's complement notation as (0, 1, 1, where the left-most bit (0) represents the positive sign of the reliability value and the other bits (1, 1) represent the reliability value of 3).

Alternatively, or additionally, optical receiver 120 may determine that the amplitude is less than a second threshold (e.g., −1 volt, −3 volts, etc.). When the amplitude is less than the second threshold, optical receiver 120 may insert, into the sample, reliability bits that correspond to the first level of reliability (e.g., represented by a second reliability value of −3 or some other second reliability value) for a bit likely to have been transmitted as a logical space associated with a second value (e.g., a value of 0 or some other second value). The reliability bits may, in this example, be encoded in two's complement notation as (1, 0, 1, where left-most bit (1) represents the negative sign of the reliability value and the other bits (0, 1) represent the reliability value).

Alternatively, or additionally, optical receiver 120 may determine that the amplitude, is less than a third threshold (e.g., 0.25 volts, or some other value) and is greater than a fourth threshold (e.g., −0.25 volts, or some other value). When the amplitude is less than the third threshold and greater than the fourth threshold, optical receiver 120 may insert, into the sample, reliability bits that correspond to a second level of reliability (e.g., a third reliability value of 0 or some other third reliability value). The reliability bits may, in this example, be encoded in two's complement notation as (0, 0, 0).

Optical receiver 120 may insert, into the sample, other reliability bits associated with one or more third levels of reliability that are less than the first level of reliability and greater than the second level of reliability (e.g., +2, +1, etc.), for positive amplitudes that are less than the first threshold and greater than the third threshold. Additionally, or alternatively, optical receiver 120 may insert, into the sample, other reliability bits associated with one or more third levels of reliability (e.g., −2, −1, etc.), for negative amplitudes that are greater than the second threshold and less than the fourth threshold. Optical receiver 120 may output, to FEC device 130, an electrical signal that includes a stream of samples that identify levels of reliability (e.g., based on the reliability bits) of payload bits included within the samples.

FEC device 130 may include one or more devices that receive, process, and/or perform other operations on the electrical signals, received from optical receiver 120, in a manner described herein. FEC device 130 may receive electrical signals from optical receiver 120 and may perform a FEC operation on the electrical signal to identify and/or correct errors within the electrical signal and/or to remedy a condition, associated with the electrical signal, caused by the identified errors.

Figure 2:
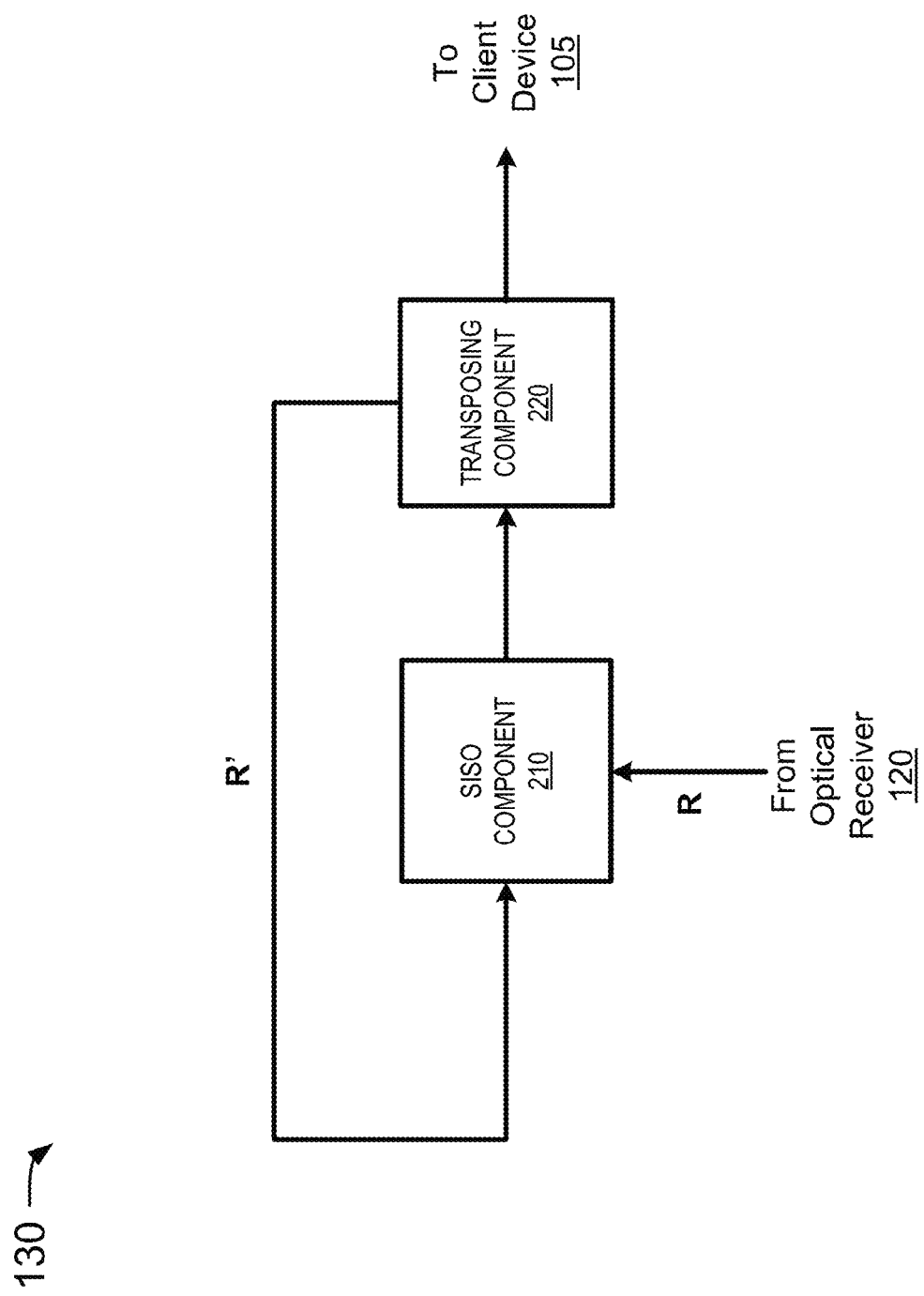
FIG. 2 is a diagram of example components of an error correction device of FIG. 1.

FIG. 2 is a diagram of example components of FEC device 130. As illustrated in FIG. 2, FEC device 130 may include a collection of components, such as a soft-input-soft-output (SISO) component 210 and a transposing component 220. Although FIG. 2 shows example components of FEC device 130, in other implementations, FEC device 130 may contain fewer components, additional components, different components, or differently arranged components than depicted in FIG. 2. Alternatively, or additionally, one or more of the components of FEC device 130 may perform one or more functions described as being performed by another one or more of the components of FEC device 130.

SISO component 210 may include one or more components that receive, process, and/or perform operations on an electrical signal, received from optical receiver 120, in a manner described herein. SISO component 210 may, for example, receive a block (or a frame) of a fixed quantity of samples from optical receiver 120 (e.g., shown as R) and may perform a soft, iterative forward error correction operation on the block of samples. In one example, SISO component 210 may perform the operation on one or more encoded words or portions of the encoded words (hereinafter referred to collectively as "segments" and individually as "segment"), based on one or more rows and/or columns of samples obtained from the block of samples. Additionally, or alternatively, SISO component 210 may output, to transposing component 220, the encoded words and/or segments on which the operation was performed. Transposing component 220 may transpose the rows and columns of the encoded words and/or segments and may output, to SISO component 210, a processed block of samples (e.g., shown as R') based on transposing the rows and columns of the encoded words and/or segments.

SISO component 210 may also, or alternatively, perform another iteration using the processed block of samples (e.g., corresponding to R') and the original block of samples (e.g., corresponding to R) to generate another processed block of samples (e.g., R') that includes fewer errors than the processed block of samples. SISO component 210 may perform the iterations by alternating between rows and columns and/or based on some other pattern of processing. SISO component 210 may, for each iteration, dynamically adjust a reliability value, associated with each sample, to cause the quantity of errors to decrease, with each successive iteration, until the operation converges (e.g., when all the errors are corrected).

Transposing component 220 may include one or more components that allow samples associated with the block of samples to be stored, retrieved, and/or transposed. In an example implementation, transposing component 220 may include a memory that stores the block of samples within rows and/or columns associated with a forward error correction frame. Transposing component 220 may write samples to the rows and/or columns and/or may read samples from the rows and/or columns. Transposing component 210 may also, or alternatively, cause a sample, that is stored at a location within a row, to be read from the row and written to a location within a column. Additionally, or alternatively, transposing component 210 may also, or alternatively, cause another sample, that is stored at a location within a column, to be read from the column and written to a location within a row.

Figure 3:
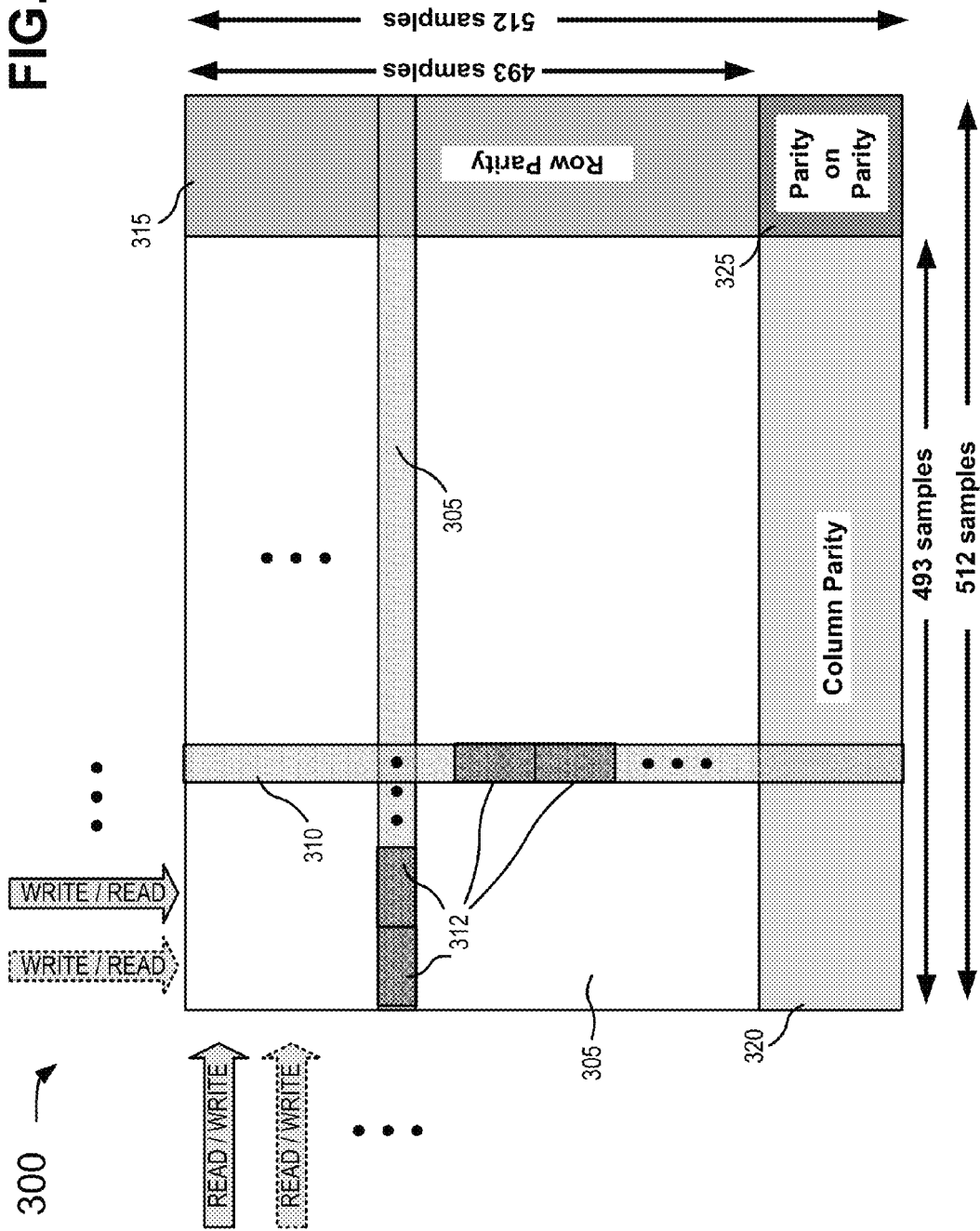
FIG. 3 is a diagram of an example data structure that stores encoded words according to an implementation described herein.

FIG. 3 is a diagram of an example data structure 300 that stores encoded words according to an implementation described herein. In one example, data structure 300 may be stored in a memory associated with FEC device 130. Additionally, or alternatively, data structure 300 may be stored in a memory associated with optical receiver 120. As shown in FIG. 3, data structure 300 may include an encoded word field 305, a row parity field 315, a column parity field 320, and/or a parity on parity field 325. The quantity of fields, within data structure 300, are included for explanatory purposes. Additionally, or alternatively, there may be additional fields, fewer fields, different fields, or differently arranged fields than are shown with respect to data structure 300.

Encoded word field 305 may store encoded words 310, as a block or frame of encoded words 310, in horizontal rows and/or vertical columns associated with data structure 300. Encoded words 310 may include a set of samples. Each sample may include one or more encoded payload bits associated with a client signal, one or more bits used for error identification and/or correction, and/or one or more reliability bits that identify a level of reliability associated with the payload bits. Encoded words 310 may be horizontally stored within rows and/or vertically stored within columns associated with encoded word field 305. A quantity of samples, associated with the encoded words, may be predetermined based on capacities of horizontal rows and/or vertical columns of data structure 300. In one example, data structure may have a capacity based on 512 rows and 512 columns. Therefore, each encoded word 310 may include 512 samples that are based on the capacity of data structure 300.

By way of example, FEC device 130 may horizontally write samples to a row as an encoded word 310. A different encoded word 310 may be horizontally written to each row (e.g., as shown by the right-pointing arrows labeled as "read/write") until data structure 300 has reached capacity. Alternatively, or additionally, FEC device 130, may vertically write samples to a column as an encoded word 310. A different encoded word 310 may be written to each column (e.g., as shown by the down-pointing arrows labeled as "write/read") until data structure 300 has reached capacity. Encoded words 310 may also, or alternatively, be read from the rows and processed by FEC device 130, and the processed encoded words 310 may be written to the rows. Additionally, or alternatively, encoded words 310 may be read from the columns and processed by FEC device 130, and the processed encoded words 310 may be written to the columns.

Additionally, or alternatively, each encoded word 310 may be written to and/or read from a row and/or column as one or more segments 312. Segment 312 may include a subset of the samples included within encoded word 310. In one example, encoded word 310 that includes 512 samples may include 64 segments when each segment includes eight samples. In another example, encoded word 310 may include 32 segments 312 when segment 312 includes sixteen samples.

Row parity field 315, may store error correction bits that can be used, by FEC device 130, to identify and/or correct errors within encoded words 310 and/or segments 312, stored within the horizontal rows, on an iterative basis. Column parity field 320 may store other error correction bits that can be used, by FEC device 130, to identify and/or correct errors, on an iterative basis, within encoded words 310 and/or segments 312. Parity on parity field 325 may store error correction bits that can be used, by FEC device 130, to identify and/or correct errors, on an iterative basis, within row parity field 315 and/or column parity field 320.

In an example implementation, data structure 300 may be sized to conform to a block of samples and/or a forward error correction frame of samples. Data structure 300 may, for example include 512 rows and 512 columns (e.g., 512×512) and may store encoded words 310 in 493 rows (e.g., rows 0 through 492) and error correction bits, associated with column parity field 320, in the remaining rows (e.g., rows 493 through 512). Additionally, or alternatively, data structure 300 may store encoded words 310 within 493 columns (e.g., columns 0 through 492) and error correction bits, associated with row parity field 315, in the remaining columns (e.g., columns 493 through 512).

While the description below describes a soft iterative forward error correction operation in the context of a 512×512 data structure, such as data structure 300, for explanatory purposes, in other implementations, for example, the soft iterative forward error correction operation could be performed using a data structure with a quantity of rows and/or columns that are different from 512×512.

Figure 4:
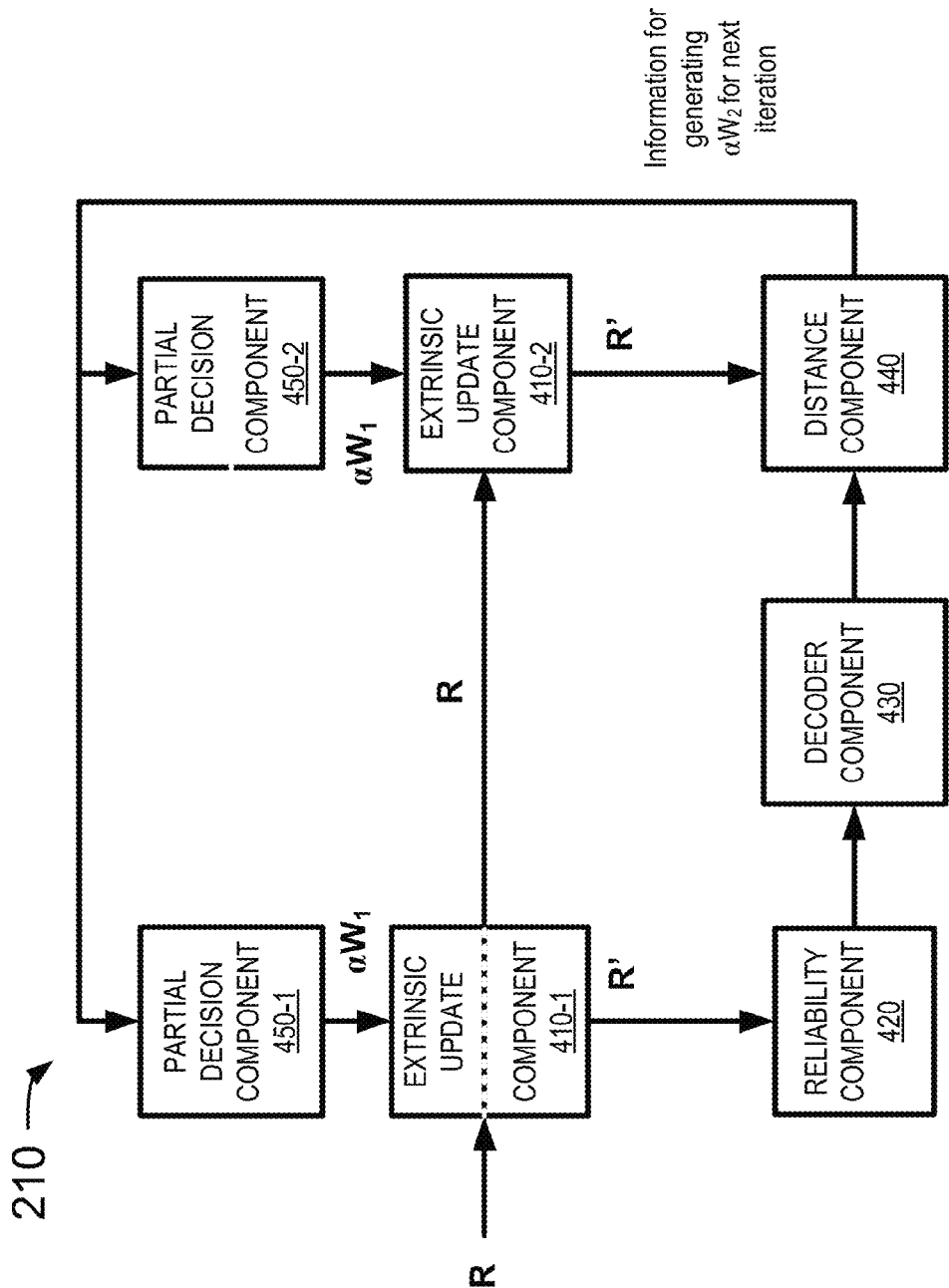
FIG. 4 is a diagram of example functional components of a soft-in-soft-out (SISO) component of FIG. 2.

FIG. 4 is a diagram of example functional components of SISO component 210. As illustrated in FIG. 4, SISO component 210 may include a set of functional components, such as a pair of extrinsic update components 410-1 and 410-2 (hereinafter referred to collectively as "update components 410" and individually as "update component 410"), a reliability component 420, a decoder component 430, a distance component 440, and a pair of partial decision components 450-1 and 450-2 (hereinafter referred to collectively as "decision components 450" and individually as "decision component 450").

Although FIG. 4 shows example functional components of SISO component 210, in other implementations, SISO component 210 may contain fewer functional components, additional functional components, different functional components, or differently arranged functional components than depicted in FIG. 4. Alternatively, or additionally, one or more of the functional components of SISO component 210 may perform one or more functions described as being performed by another one or more of the functional components of SISO component 210.

Update component 410 may receive a segment of an encoded word and may update the segment based on extrinsic information, associated with a previously received encoded word, for each sample within the segment. For example, a first update component 410 (e.g., update component 410-1) may receive a first segment (e.g., R) (e.g., from data structure 300 of FIG. 3) that includes a subset of samples associated with an encoded word. Update component 410 may also, or alternatively, receive, from a first decision component 450 (e.g., decision component 450-1), first extrinsic information (e.g., $\alpha W_1$) that corresponds to the first segment (e.g., a first quantity of samples or positions associated with the encoded word). The extrinsic information (hereinafter referred to, in some instances, as "soft metrics") may cause a reliability level of a bit, associated with the segment, to be increased, unchanged, or decreased based on processing that occurred during a previous iteration (e.g., associated with the previous encoded word). Update component 410 may, on a per bit basis, generate an updated segment (e.g., R') by combining (e.g., adding) the first segment with the first extrinsic information (e.g., $R'=R+\alpha W_1$).

In one example, the extrinsic information may be modified by a weighting value (e.g., $\alpha$, where $\alpha \geq 0$) and may provide the updated segment to reliability component 420. During a first iteration, for example, the weighting value may be set to zero (e.g., R'=R during a first iteration and/or when $\alpha$=0). During later iterations, the weighting value may increase (e.g., 0.1, 0.2, 0.3, 1, 2, 3, etc.) as the iterations increase (e.g., 2, 3, 4, etc.). In other words, the weighting value may cause a contribution of the extrinsic information to increase as the quantity of iterations increases. The first update component 410 may continue to receive and/or process other segments associated with the encoded word and may provide, to reliability component 420, updated segments associated with the encoded word.

Additionally, or alternatively, a second update component 410 (e.g., update component 410-2) may receive, from a second decision component 450 (e.g., decision component 450-2) the first extrinsic information (e.g., $\alpha W_1$) and may update. Second update component 410 may, on a per bit basis, generate an updated segment (e.g., R') by combining (e.g., adding) the segment, associated with the encoded word (e.g., R) and the first extrinsic information (e.g., $R'=R+\alpha W_1$). Second update component 410 may provide the updated segment to distance component 440. Second update component may update segments, associated with the encoded word, in which an error has been identified.

Reliability component 420 may receive one or more updated segments, associated with an encoded word, from the first update component 410 and may process the segments to identify least reliable positions (LRPs) associated with the encoded word. For example, reliability component 420 may receive a first updated segment and may identify reliability bits, associated with samples included within the first updated segment. Reliability component 420 may also, or alternatively, use the reliability bits to determine a respective reliability value for each of the samples. Reliability component 420 may also, or alternatively, sort the samples based on the reliability values to identify a predetermined quantity of samples (e.g., one sample, two samples, N samples, etc., where N≥1) associated with one or more lowest reliability values (e.g., 0, 1, −1 etc.). Reliability component 420 may identify one or more LRPs, within the first updated segment, that correspond to the identified samples with which the lowest reliability values are associated.

Additionally, or alternatively, reliability component 420 may receive other updated segments and may identify a respective set of LRPs within each of the updated segments. Reliability component 420 may also, or alternatively, merge samples associated with the identified sets of LRPs and may sort the merged samples based on reliability values associated with the merged samples. Reliability component 420 may also, or alternatively, identify one or more LRPs based merged samples to which the lowest reliability values correspond. Reliability component may provide information that identifies the LRPs and/or may provide the samples, associated with the LRPs, to decoder 430. Each of the LRPs may identify a respective position (e.g., position k, where 0≤k≤511, for a 512×512 frame) or bit within the encoded word. While the description below identifies the quantity of selected LRPs as including the six LRPs (e.g., where N=6) for explanatory purposes, the quantity of selected LRPs may, in other implementations, include a different quantity of LRPs.

Decoder component 430 may receive LRPs, may generate candidate words based on the LRPs, and/or may decode the candidate words to identify errors within each of the candidate words. For example, decoder component 430 may receive, from reliability component 420, one or more LRPs associated with an encoded word and may generate candidate words based on the LRPs. Decoder component 430 may, for example, create a first candidate word by inverting a first bit, within the encoded word, that corresponds to a first LRP. Decoder component 430 may invert a bit by causing a first value (e.g., +1 or some other first value), associated with the bit, to be changed to a second value (e.g., −1 or some other second value) or by causing the second value, associated with the bit, to be changed to the first value. Additionally, or alternatively, decoder component 430 may create a second candidate word by inverting one or more second bits, within the encoded word, that corresponds to one or more other LRPs. In other words, decoder component 430 may identify different candidate words by inverting different combinations of bits (e.g., $M=2^N$, where M represents the quantity of candidate words) associated with the encoded word, based on the quantity of LRPs. Thus, in one example, when six LRPs are identified, decoder component 430 may create 64 candidate words (e.g., $2^6$=64) by inverting different combinations of bits, associated with the encoded word, that correspond to the six LRPs.

Additionally, or alternatively, decoder component 430 may decode the candidate words to identify errors within the candidate words. For example, decoder component 430 may, in one example, identify an error within a sample associated with a LRP (hereinafter referred to, in some instances, as a "LRP error"). Decoder component 430 may also, or alternatively, identify an error associated with a sample that is not associated with a LRP (hereinafter referred to, in some instances, as a "non-LRP error"). Similarly, decoder component 430 may identify one or more errors and/or positions, within each candidate word, at which the errors are detected.

Also, or alternatively, decoder component 430 may identify a quantity of errors associated with each candidate word and may, for example, discard a candidate word that includes a quantity of errors (hereinafter referred to, in some instances, as "uncorrectable errors") that is greater than a error processing capacity associated with FEC device 130. Additionally, or alternatively, decoder component 430 may identify a duplicate candidate word that includes only LRP errors (e.g., that correspond to inverted samples associated with LRPs). Decoder component 430, in this example, may discard the duplicate candidate word. Decoder component 430 may provide, to distance component 440, candidate words that are not duplicate candidate words and/or that do not include uncorrectable errors.

Distance component 440 may receive candidate words and may process the candidate words to determine relative measures of similarity between the candidate words and the word. The relative measures of similarity may, for example, be represented by distances between the candidate words and the updated word (e.g., R') received from second update component 410-2. For example, distance component 440 may receive, from decoder component 430, the candidate words and may compare, on a per bit basis, a candidate word with the updated word. Distance component 440 may, based on the comparison of the bits, determine whether one or more bits, of the candidate word, do not match one or more bits of the updated word. Distance component 440, may determine a distance (e.g., a Euclidean distance, a Hamming distance, etc.) between the candidate bit and the updated word based on the quantity of bits that do not match. The distance may represent the measure of similarity between the candidate word and the word.

In one example, distance component 440 may perform the distance calculation based on some or all segments associated with each candidate word and some or all segments associated with the updated word. Distance component 440 may, for example, determine a set of first partial distances between first segments of the candidate words and a first segment of the updated word. Additionally, or alternatively, distance component 440 may determine other sets of partial distances between other segments of the candidate words and other segments of the updated word. Additionally, or alternatively, distance component 440 may generate distances for segments of candidate words that include a LRP and/or a sample with which an error is associated. Distance component 440 may identify one or more best candidate words associated with one or more shortest distances. Distance component 440 may provide, to decision component 450, the sets of partial distances and/or segments associated with the best candidate words.

Decision component 450 may generate extrinsic information based on the best candidate words and/or measures of similarity between candidate words and an encoded word. For example, decision component 450 may receive, from distance component 440, distances associated with the candidate words and may select a candidate word associated with a shortest distance (hereinafter referred to, in some instances, as a "best candidate word" or "vector D"). Based on the best candidate word, decision component 450 may select a competitor word (sometimes referred to as "second best candidate word" or "vector C") to be used to generate extrinsic information. Additionally, or alternatively, one or both best candidate words, such as vector D and/or vector C, may be identified by distance component 440.

Decision component 450 may determine the extrinsic information based on distances between the updated word and the best candidate word and the second best candidate word. The extrinsic information may allow decision component 450 to adjust (e.g., increase or decrease), on a per bit basis, a level of reliability associated with the encoded word.

Additionally, or alternatively, decision component 450 may determine extrinsic information, associated with the best candidate word and second best candidate word, based on partial distances associated with segments of candidate words. For example, decision component 450 may receive, from distance component 440, first partial distances associated with first segments of the candidate words and may determine a best candidate segment by identifying a shortest partial distance. Additionally, or alternatively, distance component 450 may use the best candidate segment and the other candidate segments to identify a second best candidate segment. Additionally, or alternatively, decision component 450 may determine partial extrinsic information (e.g., partial $\alpha W$), associated with the first segment based on partial distances associated with the best candidate segment and/or the second best candidate segment. Decision component 450 may also, or alternatively, determine a best candidate segment associated with segments and/or samples that include a LRP and/or with which an error is associated. Decision component 450 may provide partial extrinsic information to update component 410-1 and/or 410-2.

Figure 5:
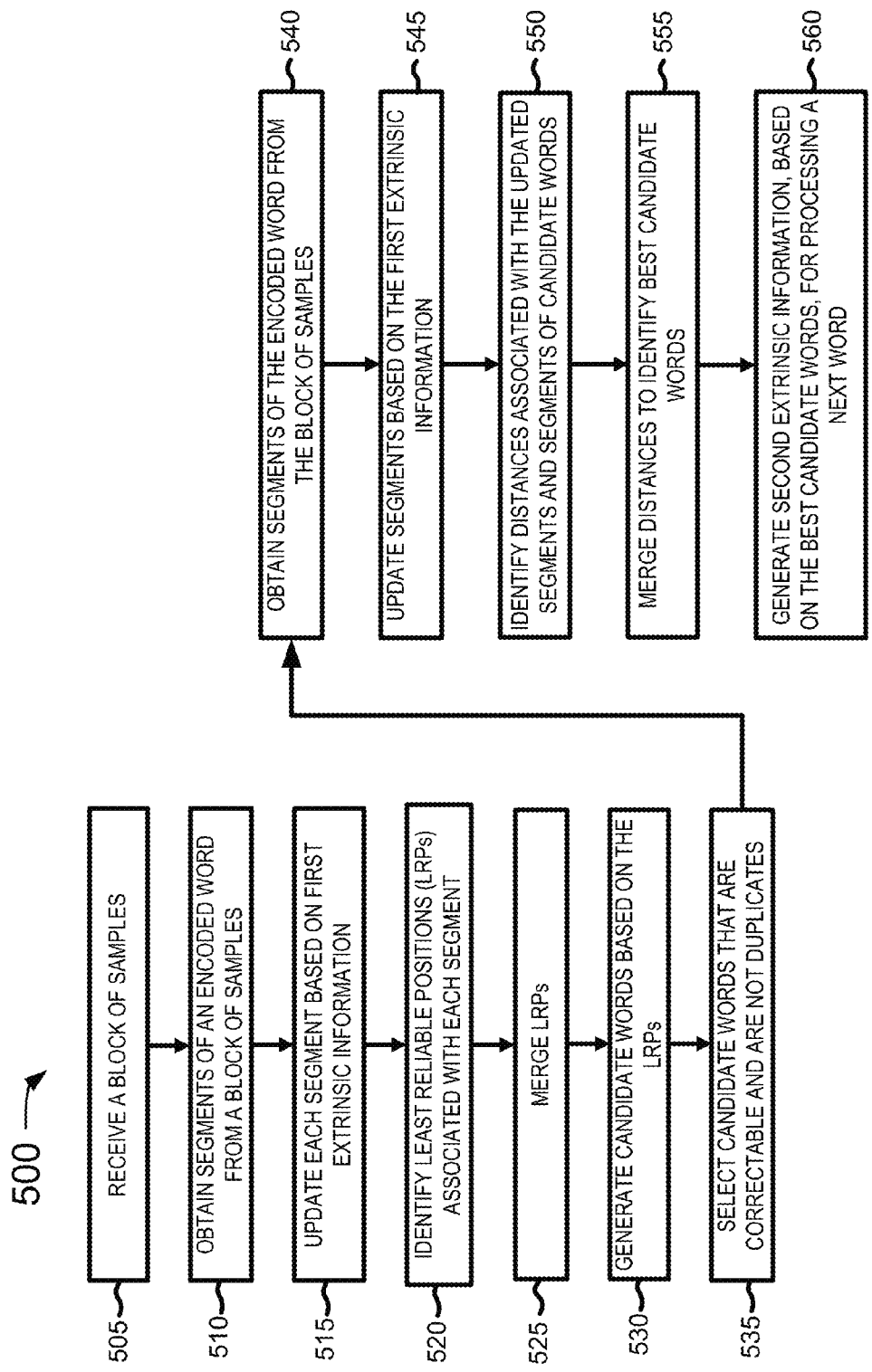
FIG. 5 is a flow chart an example process for performing soft iterative forward error correction on segments of an encoded word.
Figure 6A:
FIGS. 6A and 6B are diagrams of example processing cycles associated with a portion of a soft iterative forward error correction on segments of an encoded words.
Figure 6B:

FIG. 5 is a flow chart an example process 500 for performing soft iterative forward error correction on segments of an encoded word. In an example implementation, process 500 may be performed by FEC device 130. Alternatively, or additionally, some or all of process 500 may be performed by a device or collection of devices separate from, or in combination with, FEC device 130. FIGS. 6A and 6B are diagrams of example processing cycles 600 and 650 associated with a portion of a soft iterative forward error correction operation on segments of an encoded word. In the description below, a portion of process 500 will be described with references to processing cycles 600 and 650 of FIGS. 6A and 6B, respectively.

As shown in FIG. 5, process 500 may include receiving a block of samples (block 505) and obtaining segments of an encoded word from the block of samples (block 510). For example, FEC device 130 may receive, from optical receiver 120, a block of samples. FEC device 130 may identify, within the block of samples, an encoded word that includes a group of samples. The encoded word may correspond to a row or column within the block of samples.

FEC device 130 may obtain, from the encoded word, a first segment of samples. While the description below describes the block of samples as including 512 rows and/or 512 columns, each word including 64 segments, and each segment including 8 samples, in another example, the block of samples may include a different quantity of rows and/or columns (e.g., 256×256, 1024×1024, etc.), each word may include a different quantity of segments (32, 128, etc.), and each segment may include a different quantity of samples (e.g., 4, 16, etc.).

As also shown in FIG. 5, process 500 may include updating each segment based on first extrinsic information (block 515) and identifying LRPs associated with each segment (block 520). For example, FEC device 130 may generate an updated segment (e.g., R') based on the first segment (e.g., R) and extrinsic information (e.g., $\alpha W$), from a previous iteration, that corresponds to the first segment (e.g., where R'=R+$\alpha W$). For a first iteration (e.g., i=1, where i represents the iteration), FEC device 130 may, for example, determine that no extrinsic information is available (e.g., where R'=R) when the iteration corresponds to a first iteration (e.g., where $\alpha$=0 when i=1). Additionally, or alternatively, during a later iteration (e.g., a second, third, fourth, etc.), FEC device 130 may generate an updated first segment based on the first segment and extrinsic information generated during a previous iteration. The extrinsic information may include soft metrics that cause a level of reliability of bits, within the first segment to increase, stay the same or decrease.

FEC device 130 may obtain other segments (e.g., a second segment, a third segment, etc.) associated with the encoded word and may generate other updated segments based on extrinsic information associated with each of the segments. Additionally, or alternatively, FEC device 130 may obtain samples from the encoded word and may update, on a per sample basis, each sample based on extrinsic information associated with each sample.

Additionally, or alternatively, FEC device 130 may identify reliability bits within each of the samples of the first segment and may, based on the reliability bits, identify reliability values associated with each sample. FEC device 130 may also, or alternatively, sort the samples based on the reliability values and may select samples (e.g., N=6 samples or some other value), from the first segment that are associated with one or more lowest reliability values (e.g., 0, 1, etc.). Similarly, FEC device 130 may identify LRPs associated with each segment obtained from the encoded word.

Additionally, or alternatively, FEC device 130 may discard the updated word and/or the updated segments. Discarding the updated word and/or the updated segments may enable FEC device 130 to make available additional memory space and/or processing capacity that would have been used to store the updated word and/or segments and/or to process the updated word and/or segments, respectively. FEC device 130 may make use of the addition memory space and/or processing capacity in a manner to be described in greater detail below with respect to FIGS. 7A and 7B.

As further shown in FIG. 5, process 500 may include merging the LRPs (block 525) and generating candidate words based on the merged LRPs (block 530). For example FEC device 130 may merge first LRPs associated with the first segment and second LRPs associated with a second segment to generate a segment that includes the first and second LRPs (e.g., 12 LRPs). FEC device 130 may also, or alternatively, sort the first LRPs and the second LRPs, based on the reliability values, to identify LRPs (e.g., N=6 LRPs) associated with one or more lowest levels of reliability. FEC device 130 may also, or alternatively, identify third LRPs associated with the third segment and may, in a manner similar that described above, merge the third LRPs with the identified LRPs from the first segment and the second segments. FEC device 130 may repeat the process to identify and/or merge LRPs until LRPs for all segments of the encoded word are identified.

For example, as shown in FIG. 6A, process cycle 600 may identify a set of cycles, such as a set of cycles 605-1, ... 605-P (where P≥1) (hereinafter referred to collectively as "cycles 605" and individually as "cycle 605"). The quantity of cycles 605 within process cycle 600 is provided for explanatory purposes only. In another example, there may be fewer cycles, additional cycles, different cycles, or differently arranged cycles than are shown in FIG. 6A.

Cycle 605 may identify repetitive processing operations associated with obtaining and/or processing segments associated with an encoded word. For example, cycle 605 may identify concurrent and/or overlapping operations (e.g., overlapping in time) that may be performed, by FEC device 130, to obtain segments, update segments, identify LRPs, merge LRPs and/or select LRPs associated with the encoded word in a manner similar to that described above with respect to blocks 505 to 525 of FIG. 5.

By way of example, first cycle 605 (e.g., 605-1) may identify a first operation to obtain a first segment from the encoded word and/or to update the first segment based on first extrinsic information (e.g., shown as "R' update Segment 1" of FIG. 6A). Second cycle 605 (e.g., cycle 605-2) may identify a second operation to obtain a second segment from the encoded word and/or to update the second segment (e.g., shown as "R' update Segment 2" of FIG. 6A). Second cycle 605 may also, or alternatively, identify a first operation to sort samples, within the first updated segment, based on reliability values associated with the first updated segment (e.g., shown as "LRP sort Segment 1" of FIG. 6A).

Third cycle 605 (e.g., cycle 605-3) may identify a third operation to obtain a third segment from the encoded word and/or to update the third segment (e.g., shown as "R' update Segment 3" of FIG. 6A). Third cycle 605 may also, or alternatively, identify a second operation to sort samples within the second updated segment (e.g., shown as "LRP sort Segment 2" of FIG. 6A). Third cycle 605 may also, or alternatively, identify a first operation to identify first LRPs, associated with the first updated segment, based on lowest reliability values identified by sorting the samples in second cycle 605 (e.g., shown as "Identify LRPs Segment 1" of FIG. 6A). Fourth cycle 605 (e.g., cycle 605-4) may identify a fourth operation to obtain a fourth segment from the encoded word and/or to update the fourth segment (e.g., shown as "R' update Segment 4" of FIG. 6A). Fourth cycle 605 may also, or alternatively, identify a third operation to sort samples within the third updated segment (e.g., shown as "LRP sort Segment 3" of FIG. 6A). Fourth cycle 605 may also, or alternatively, identify a first operation to identify second LRPs, associated with the second updated segment and to merge the second LRPs with the first LRPs from the first updated segment (e.g., shown as "Merge LRPs Segment 2" of FIG. 6A). Process cycle 600 may include other cycles 605 (e.g., cycles 605-5-605-P) that identify operations to process each segment obtained from the encoded word.

Returning to FIG. 5, FEC device 130 may, for example, create candidate words, associated with the updated encoded word, by inverting different combinations of bits that correspond to the identified LRPs (e.g., $2^N$ combinations=$2^6$=64 candidate words). For example, FEC device 130 may generate a candidate word that does not include any inverted bits. Additionally, or alternatively, FEC device 130 may generate a second candidate word by inverting a bit, within the encoded word, that corresponds to a first LRP. FEC device 130 may also, or alternatively, generate other candidate words by inverting other bits that correspond to one or more LRPs.

As still further shown in FIG. 5, process 500 may include selecting candidate words that are correctable candidate words and are not duplicate candidate words (block 535). For example, FEC device 130 may decode each of the candidate words using an error correction code and/or based on error correction information included within each sample within the candidate word. The error correction code may, for example, be associated with another error correction code, used by optical transmitter 110, to generate the encoded samples (e.g., a BCH code and/or some other code).

Additionally, or alternatively, FEC device 130 may compare bits, associated with the candidate words, with bits within the word associated with a previous iteration. FEC device 130 may identify bits, within the candidate words, that do not match bits within the word associated with the previous iteration (hereinafter referred to, in some instances, as "non-matching bits"). Based on the non-matching bits, FEC device 130 may identify LRP errors (e.g., non-matching bits that correspond to LRPs) and/or non-LRP errors (e.g., non-matching bits that do not correspond to the LRPs). FEC device 130 may identify candidate words that include only LRP errors and may determine that the candidate word is a duplicate of a first candidate word (e.g., that does include any LRP errors). Additionally, or alternatively, FEC device 130 may identify candidate words that include a quantity of non-LRP errors that causes the candidate words to be uncorrectable (e.g., when the quantity of non-LRP errors is greater than an error processing capacity of FEC device 130). FEC device 130 may select candidate words that are not duplicate candidate words and/or that are correctable candidate words.

As further shown in FIG. 5, process 500 may include obtaining segments of the encoded word from the block of samples (block 540) and updating the segments based on the first extrinsic information (block 545). For example, FEC device 130 may, in a manner similar to that described above with respect to block 510, obtain a segment from the encoded word associated with the block of samples. FEC device 130 may also, or alternatively, determine whether the segment includes a sample associated with an error. When the segment does not include a sample associated with the error, FEC device 130 may use an updated segment that was previously updated with the first extrinsic information (e.g., in a manner described above with respect to block 515).

Additionally, or alternatively, when the segment includes a sample associated with the error, FEC device 130 may, on a per bit basis and in a manner similar to that described above with respect to block 515, update the segment, or the sample within the segment associated with the error, based on the first partial extrinsic information (e.g., $R'=R+\alpha W_1$, where $W_1$ represents the first partial extrinsic information associated with the segment). Additionally, or alternatively, FEC device 130 may update the other samples, on a per bit basis, within the segment (e.g., $tha_t$ are not $_a$ssociated with the error) based on the first partial extrinsic information.

As still further shown in FIG. 5, process 500 may include identifying distances associated with the updated segments and segments of the candidate words (block 550) and merging distances to identify best candidate words (block 555). For example, FEC device 130 may determine a measure of similarity, between the selected candidate words and the updated word. The measures of similarity may, for example, be based on partial distances (e.g., Euclidean distances, Hamming distances, etc.) between segments of the selected candidate words and updated segments associated with the word. The distances may also, or alternatively, be determined on a bit-by-bit basis (or a position-by-position basis). FEC device 130 may identify respective distances for each of the selected candidate words and may associate the respective distances with each of the selected candidate words.

Additionally, or alternatively, FEC device 130 may determine distances based on a combination (e.g., a sum or some other combination) of reliability values associated with each sample of the selected candidate words. Additionally, or alternatively, FEC device 130 may determine distances for the selected candidate words based on a combination of reliability values associated with the LRPs and/or parity bits associated with the selected candidate words. By way of example, FEC device 130 may determine a distance, associated with a selected candidate word, based on first reliability values for the six LRPs (e.g., {0,0,0,+3, −2, −2}) and a first reliability value associated with a parity bit (e.g., {−5}) of the candidate word and second reliability values of the six LRPs (e.g., {−1,0,0,+3, −2, −2}) and a second reliability value associated with a parity bit (e.g., {−5}) of the updated word. In this example, FEC device 130 may determine a sum of the first reliability values (e.g., 0+0+0+3−2−2−5=−6) and a sum of the second reliability values (e.g., −1+0+0+3−2−2−5=−7). Additionally, or alternatively, FEC device 130 may determine the distance based on a difference between the sum of the first reliability values and the sum of the second reliability values (e.g., distance=|−−−6|=|−1|=1).

Additionally, or alternatively, FEC device 130 may determine the distances on a per segment basis. For example, FEC device 130 may obtain a first segment from a candidate word and identify non-matching bits between the first segment of the candidate word and an updated first segment of the word associated with the previous iteration. FEC device 130 may determine a first partial distance between the first segment associated with the candidate word and the first segment associated with the updated first segment. Similarly, FEC device 130 may also, or alternatively, determine partial distances for other segments (e.g., a second segment, a third segment, etc.) of the candidate word. FEC device 130 may determine a distance, associated with the candidate word, based on a combination of the partial distances associated with the segments of the candidate word.

Additionally, or alternatively, FEC device 130 may, in a manner similar to that described above, determine partial distances for each segment based on a sum of reliability values associated each segment within the selected candidate words. FEC device 130 may also, or alternatively, determine a distance for the candidate word based on a combination of the partial distances associated with the segment.

Additionally, or alternatively, FEC device 130 may identify a shortest distance, among the distances associated with the selected candidate words, and may select a best candidate word (e.g., vector D) associated with the shortest distance. Additionally, or alternatively, FEC device 130 may, on a per bit basis, identify another best candidate word, such as a competitor word (e.g., vector C), from the candidate words that were not selected as the best candidate word.

Additionally, or alternatively, FEC device 130 may determine a shortest partial distance associated with a first segment of each candidate word and may identify a best first segment (e.g., a partial vector D) associated with the shortest partial distance. Additionally, or alternatively, FEC device 130 may, on a per bit basis, identify another best first segment, such as a competitor first segment (e.g., partial vector C), from the first segments that were not selected.

For example, as shown in FIG. 6B, process cycle 660 may identify a set of cycles, such as a set of cycles 655-1, . . . 655-Q (where Q≥1) (hereinafter referred to collectively as "cycles 655" and individually as "cycle 655"). The quantity of cycles within process cycle 650 is provided for explanatory purposes only. In another example, there may be fewer cycles, additional cycles, different cycles, or differently arranged cycles than are shown in FIG. 6B.

Cycle 655 may identify one or more repetitive processing operations associated with obtaining and/or processing segments obtained from an encoded word. For example, cycle 655 may identify concurrent and/or overlapping operations (e.g., overlapping in time) that may be performed, by FEC device 130, to obtain segments, update segments, identify measures of similarity, and/or merge segments, based on the measures of similarity, associated with the encoded word in a manner similar to that described above with respect to blocks 555 to 570 of FIG. 5.

By way of example, first cycle 655 (e.g., 655-1) may identify a first operation to obtain a first segment from the encoded word and/or to update the first segment based on first extrinsic information (e.g., shown as "R' update Segment 1" of FIG. 6B). Second cycle 655 (e.g., cycle 655-2) may identify a second operation to obtain a second segment from the encoded word and/or to update the second segment (e.g., shown as "R' update Segment 2" of FIG. 6B). Second cycle 655 may also, or alternatively, identify a first operation to determine partial distances between the first updated segment and first segments of the selected candidate words (e.g., shown as "Distance Contribution Segment 1" of FIG. 6B).

Third cycle 655 (e.g., cycle 655-3) may identify a third operation to obtain a third segment from the encoded word and/or to update the third segment (e.g., shown as "R' update Segment 3" of FIG. 6B). Third cycle 655 may also, or alternatively, identify a second operation to determine partial distances between the second updated segment and second segments of the selected candidate words (e.g., shown as "Distance Contribution Segment 2" of FIG. 6B). Third cycle 655 may also, or alternatively, identify a first operation to determine bits to identify, on a per bit basis, a first segment of a candidate word associated with a shortest distance and a first segment of another candidate word associated with a next shortest distance (e.g., shown as "Merge Distances Segment 1" of FIG. 6B). The first segment associated with the shortest distance may represent a partial best candidate word (e.g., partial vector D) and the first segment associated with a next shortest distance may represent a partial competitor word (e.g., partial vector C).

Fourth cycle 655 (e.g., cycle 655-4) may identify a fourth operation to obtain a fourth segment from the encoded word and/or to update the fourth segment (e.g., shown as "R' update Segment 4" of FIG. 6B). Fourth cycle 655 may also, or alternatively, identify a third operation to determine partial distances between the third updated segment and third segments associated with the selected candidate words (e.g., shown as "Distance Contribution Segment 3" of FIG. 6B). Fourth cycle 655 may also, or alternatively, identify a second operation to identify a second partial best candidate word and a second partial competitor word (e.g., shown as "Merge Distance Segment 2" of FIG. 6B). Process cycle 650 may include other cycles 655 (e.g., cycles 655-5-655-Q) that identify operations to process each segment obtained from the encoded word to create a best candidate word (vector D) and/or a competitor word (vector C).

Returning to FIG. 5, process 500 may include generating second extrinsic information, based on the candidate words, for processing a next word (block 560). For example, FEC device 130 may use one or more known techniques to generate second extrinsic information (e.g., $W(k) \cong sign(D(k))^* (distance(C)-distance(D))-R'(k)$, where k represents a bit within a word or segment and where $sign(D(k))$ represents a sign of a bit k within vector D) based on vector C and vector D. Additionally, or alternatively, FEC device 130 may generate second partial extrinsic information (e.g., partial $\alpha W_2$) based a first segment associated with partial vector D and/or a first segment associated with partial vector C. Additionally, or alternatively, FEC device 130 may, on a per segment basis, generate second partial extrinsic information based on partial vector Ds and partial vector Cs associated with each segment. FEC device 130 may use the second extrinsic information to update segments associated with a next word obtained from the block of words.

Figures 7A, 7B:
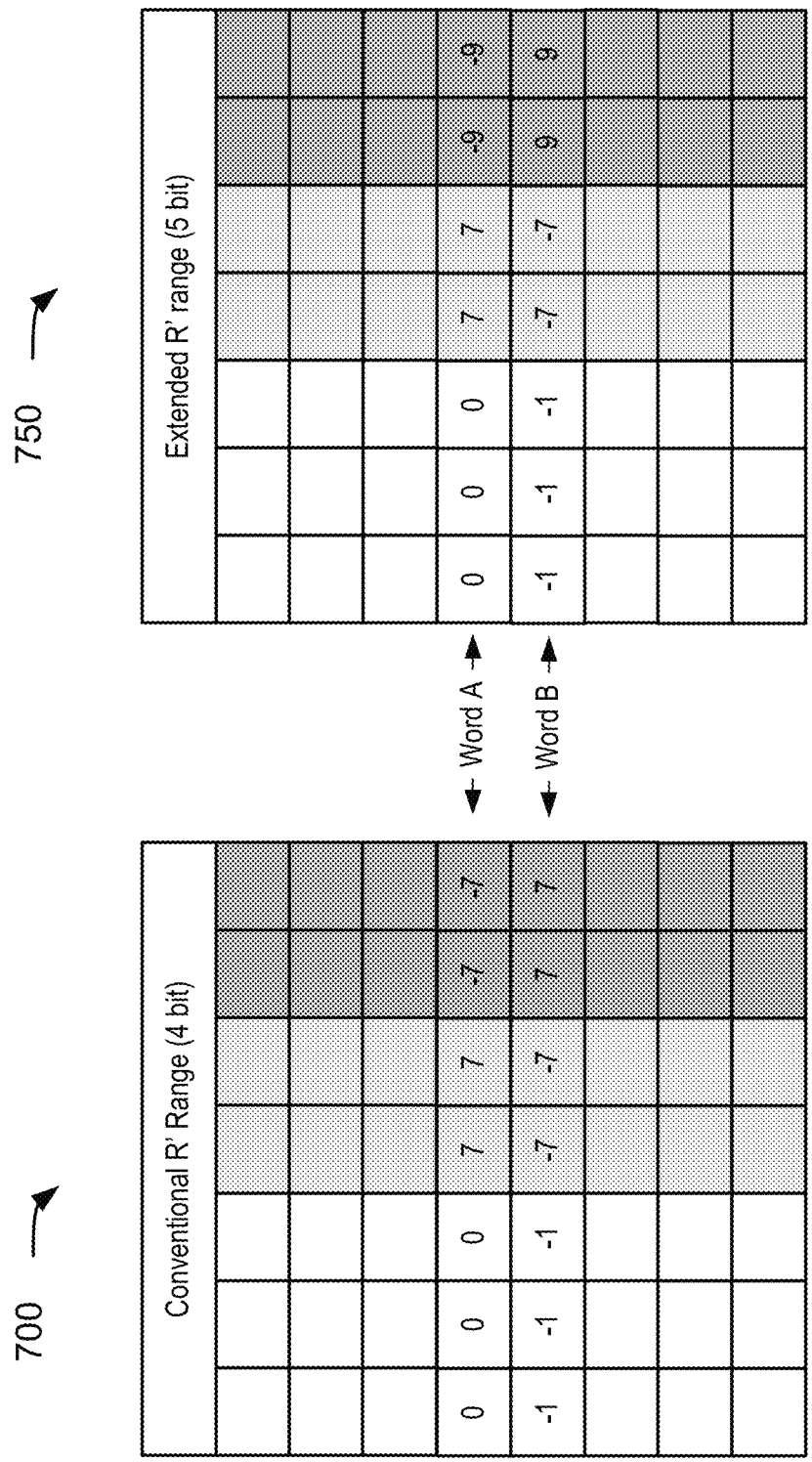
FIGS. 7A and 7B are diagrams of example soft metric data structures that store soft metrics associated with candidate words.

FIGS. 7A and 7B are diagrams of example soft metric data structures 700 and 750, respectively, that store soft metrics (e.g., reliability values, extrinsic information, etc.) associated with candidate words. Soft metric data structure 700 of FIG. 7A (hereinafter referred to as "data structure 700") may be stored in a memory associated with a conventional FEC device. Soft metric data structure 750 of FIG. 7B may be stored in a memory associated with FEC device 130.

As shown in FIG. 7A, data structure 700 may store information that identifies reliability values associated with samples within a candidate word. The reliability values may fall within a range of values that are predetermined, by a conventional FEC device, based on a quantity of available memory and/or processing capacity of the conventional FEC device. The conventional FEC device may process the encoded words by storing samples (e.g., 515×512 samples associated with the block of samples) associated with each updated encoded word (e.g., R'). Storing the samples, associated with the updated encoded words, may limit a quantity of available memory that can be used to process reliability values and/or to determine distances associated with candidate words. In the example below, the available memory may enable the conventional FEC device to process encoded words based on a range of reliability values (−8 to +7) that correspond a quantity of reliability bits use to process encoded words (e.g., a four-bit reliability value based on a first reliability bit associated with a positive or negative value, and second, third, and fourth reliability bits).

By way of example, data structure 700 may store reliability values for a first candidate word (e.g., shown as Word A) and a second candidate word (e.g., shown as Word B). The first word may correspond to a first set of reliability values ({0,0, 0,7,7,−7,−7}) and the second word may correspond to a second set of reliability values ({−1,−1,−1,−7,−7,7,7}). The conventional FEC device may determine measures of reliability (e.g., sometimes referred to as "distances") associated with the first and second words and may select a best candidate word that is most reliable. For example, the conventional FEC device may determine a first measure of reliability for the first word, based on a combination of the reliability values of the first word (e.g., |0+0+0+7+7−7−7|=0). Additionally, or alternatively, the conventional FEC device may determine a second measure of reliability for the second word based on a combination of reliability values for the second word (e.g., |−1−1−1−7−7+7+|=|−3|=3). The conventional FEC device may select, as the best candidate word, the first candidate word when the first candidate word is associated with a smallest absolute sum (e.g., 0).

As shown in FIG. 7B, data structure 750 may store information that identifies reliability values associated with samples within a candidate word and/or a segment thereof. The reliability values may fall within a range of values that are predetermined, by FEC device 130, based on a quantity of available memory and/or processing capacity of FEC device 130. FEC device 130 may process the encoded words in a manner that does not include storing samples associated with each updated encoded word (e.g., R'). By not storing the samples, FEC device 130 may have a greater quantity of available memory and/or processing capacity (e.g., greater than the conventional FEC device) with which to process encoded words. The greater amount of available memory and/or processing capacity may enable FEC device 130 to use one or more additional reliability bits and/or a greater range or sensitivity of reliability values to process the encoded words. In the example below, the available memory may enable FEC device 130 to process encoded words based on a greater range of reliability values (−16 to +15) that correspond a greater quantity of reliability bits used to process encoded words (e.g., a five-bit reliability value based on a first reliability bit associated with a positive or negative value, and second, third, fourth, and fifth reliability bits).

By way of example, data structure 750 may store reliability values for a first candidate word and/or segment (e.g., Word A) and a second candidate word and/or segment (e.g., Word B). The first word and/or segment may be associated with a first set of reliability values ({0,0,0,7,7,−9,−9}) and the second word may correspond to a second set of reliability values ({−1,−1,−1,−7,−7,9,9}). The additional reliability bits may allow reliability values, that are outside the range used by the conventional FEC device (e.g., reliability values −9 and +9 of words B and A, respectively, are outside of the permissible range, from −8 to +7, used by the conventional FEC device), to be used, by FEC device 130, to process encoded words.

Additionally, or alternatively, FEC device 130 may determine that a first measure of reliability for the first word (e.g.,

|0+0+0+7+7−9−9|=|−4|=4) is not greater than a second measure of reliability for the second word (e.g., |−1−1−1−7−7+9+9|=|−1|=1). FEC device 130 may select, as the best candidate word, the second candidate word when the second candidate word is associated with the smallest absolute sum (e.g., 1). Selection of the second candidate word may represent a different candidate word than the first candidate word selected by the conventional FEC device in the example above.

Additionally, or alternatively, FEC device 130 may make use of fractional bits when generating extrinsic information (e.g., αW, where W can be a large fractional value and where α can be a fraction value that is less than 1). For example, FEC device 130 may generate the extrinsic information using a greater quantity of bits (e.g., a larger bit width) than the conventional FEC device, which may permit FEC device 130 to generate the extrinsic information without round fractional bits to a discrete value (e.g., 0, +/−1, +/−2, etc.) as a conventional FEC device may. Use of fractional bits may enable the FEC device to increase a quantity of errors that can be corrected and/or may reduce a processing time and/or cost associated with correcting an error.

Systems and/or methods, described herein, may allow a FEC device to perform soft iterative forward error correction on an encoded word, within traffic, by processing one or more segments, of the encoded word, over a time period. The FEC device may process the encoded word on a segment-by-segment basis, which may reduce a quantity of bits of data that are used to perform the soft iterative forward error correction. Reducing the quantity of bits may enable the FEC device to reduce a quantity of hardware components, associated with the FEC device, which may reduce costs and/or complexity associated with the FEC device. Additionally, or alternatively, reducing the quantity of bits may enable the FEC device to use available memory to process encoded words with a greater level of sensitivity, which may allow a greater quantity of errors to be corrected and/or reduce a processing time associated with correcting errors.

The foregoing description provides illustration and description, but is not intended to be exhaustive or to limit the implementations to the precise form disclosed. Modifications and variations are possible in light of the above disclosure or may be acquired from practice of the implementations.

For example, while a series of blocks has been described with regard to FIG. 5, the order of the blocks may be changed in other implementations. Also, non-dependent blocks may be performed in parallel.

Furthermore, while the disclosed embodiments have been presented as generally suitable for use in an optical network, the systems and methods disclosed herein are suitable for any fiber optic network, fiber network, fiber line, or link that includes one or more transmission spans, amplifier spans, or hops.

Even though particular combinations of features are recited in the claims and/or disclosed in the specification, these combinations are not intended to limit the disclosure of the implementations. In fact, many of these features may be combined in ways not specifically recited in the claims and/or disclosed in the specification. Although each dependent claim listed below may directly depend on only one other claim, the disclosure of the implementations includes each dependent claim in combination with every other claim in the claim set.

It will be apparent that embodiments, as described herein, may be implemented in many different forms of software, firmware, and hardware in the embodiments illustrated in the figures. The actual software code or specialized control hardware used to implement embodiments described herein is not limiting of the embodiments. Thus, the operation and behavior of the embodiments were described without reference to the specific software code—it being understood that software and control hardware may be designed to implement the embodiments based on the description herein.

No element, act, or instruction used in the present application should be construed as critical or essential to the implementation unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A system comprising:
one or more devices to:
receive a word, of a block of words within traffic, on which to perform forward error correction, the word including a group of samples, each of the group of samples including respective encoded bits and respective reliability bits, the respective reliability bits corresponding to a respective level of reliability of the respective encoded bits,
obtain, from the word, a plurality of segments, each segment, of the plurality of segments, including a respective subset of samples of the group of samples,
update, on a per segment basis, the word based on first extrinsic information associated with a previously received word, of the block of words, the first extrinsic information modifying levels of reliability associated with the group of samples,
identify sets of least reliable positions (LRPs) associated with the plurality of segments, each one of the sets of LRPs corresponding to a respective portion of samples, within each segment, associated with one or more lowest levels of reliability,
create a subset of LRPs based on a subset of samples, that correspond to the sets of LRPs, associated with the one or more lowest levels of reliability,
generate candidate words based on different combinations of inverted encoded bits, within the word, that correspond to the LRPs within the subset of LRPs,
decode the word and the candidate words to identify errors within the word or the candidate words,
update one or more segments of the word based on the first extrinsic information, the one or more segments including one or more of the identified errors,
determine, on the per segment basis, distances between the candidate words and the updated word that includes the updated one or more segments,
identify two or more best candidate words associated with two or more shortest distances, and
perform the forward error correction, on a next word of the block of words, using second extrinsic information that is based on the two or more best candidate words.

2. The system of claim 1, where, when updating the word, the one or more devices are to:
obtain a first segment, of the plurality of segments, and
generate a first updated segment based on the segment and extrinsic information associated with a first segment of the previous word.

3. The system of claim 2, where, when identifying the sets of LRPs, the one or more devices are further to:
identify reliability values associated with samples within the first updated segment, sort the samples, within the first updated segment, based on the identified reliability values, and select a portion of the sorted samples, associated with the one or more lowest levels of reliability, based on the reliability values.

4. The system of claim 1, where, when creating the subset of LRPs, the one or more devices are further to:

identify a first set of LRPs associated with a first updated segment and a second set of LRPs associated with a second updated segment, sort samples that correspond to the first set of LRPs and the second set of LRPs based on reliability values associated with the samples, and select a portion of the sorted samples, associated with the one or more lowest levels of reliability, based on the reliability values.

5. The system of claim 1, further comprising:

a storage device to store the candidate words or the updated word; and where, after identifying the sets of LRPs associated with the plurality of segments, the one or more devices are further to:

discard the updated word, discarding the updated word enabling memory space, within the storage device, to be made available to process words based on a range of reliability values that is greater than a threshold.

6. The system of claim 1, where, when determining the distances between the candidate word and the updated word, the one or more devices are further to:

compare, on a per bit basis, each bit within a first segment, of a candidate word, to a corresponding different bit within another first segment of the updated word that includes the updated one or more segments, identify, as a first partial distance and based on the comparison, a quantity of bits, associated with the first segment, that do not match bits of the other first segment, and identify a distance, associated with the candidate word, based on the first partial distance and other partial distances associated with other segments of the candidate word.

7. The system of claim 6, where the one or more devices are further to:

determine that the candidate word is a best candidate word when the distance is less than other distances associated with other candidate words.

8. The system of claim 1, where the one or more devices are further to:

identify, for a first candidate word, a first distance based on a first sum of reliability values associated with the first candidate word, that correspond to the subset of LRPs, identify, for a second decoded candidate word, a second distance based on a second sum of reliability values, associated with the second decoded candidate word, that correspond to the subset of LRPs, and determine that the second decoded candidate word is the best word when the second sum is less than the first sum.

9. The system of claim 1, where, when update one or more segments of the word, the one or more devices are further to:

obtain a first segment associated with the word, determine whether the first segment includes a sample with which an error is associated, update the first segment based on the first extrinsic information when first segment includes the error, and obtain a second segment, associated with the word, when the first segment does not include the error, where obtaining the second segment does not include updating the first segment.

10. A method comprising:

receiving, from an optical receiver and by a device, a word, of a block of words within traffic, on which to perform forward error correction, the word including encoded bits and sets of reliability bits for identifying a respective level of reliability of each of the encoded bits;

updating, by the device, a first segment of the word and a second segment of the word based on first extrinsic information, the first segment including a first subset of the encoded bits, the second segment including a second subset of the encoded bits, and the first extrinsic information modifying reliability bits associated with the first subset and the second subset;

identifying, by the device, first least reliable positions (LRPs) within the updated first segment and second LRPs within the updated second segment, the first LRPs corresponding to first bits within the first subset with a lowest level of reliability, the second LRPs corresponding to second bits within the second subset with another lowest level of reliability;

identifying, by the device, LRPs, within the word, based on a subset of a combination of the first bits and the second bits associated with one or more lowest levels of reliability;

generating, by the device, candidate words based on different combinations of inverted encoded bits, within the word, that corresponds to the identified LRPs;

identifying, by the device, errors within the word or the candidate words;

updating, by the device and based on the first extrinsic information, a first encoded bit, within the first segment, in which an error is identified;

determining, by the device, first partial distances between the updated first segment and first segments of the candidate words and second partial distances between the second segment and second segments of the candidate words;

generating, by the device, second extrinsic information based on two or more best words of the candidate words, the two or more best words corresponding to two or more shortest first partial distances and two or more shortest second partial distances; and processing, by the device, a next word, of the block of words, using the second extrinsic information.

11. The method of claim 10, where the first extrinsic information is generated based on performing forward error correction on a previously received word of the block of words.

12. The method of claim 10, where after determining the first partial distances and the second partial distances, the method further includes:

discarding the updated first segment and the second segment.

13. The method of claim 10, further comprising:

identifying one of the first partial distances based on one of:

identifying a quantity of bits, associated with a first segment of a first candidate word, that do not match encoded bits associated with the updated first segment; or identifying a difference between a first sum of reliability values that correspond to encoded bits associated with the first segment of the first candidate word and a second sum of reliability values that correspond to encoded bits associated with the first updated segment; and selecting the first segment of the first candidate word on which to base one of the two or more best words when the one of the first partial distances is less than other ones of the first partial distances.

14. The method of claim 10, further comprising:

generating a plurality of partial distances associated with candidate words, each partial distance, corresponding to a respective shortest partial distance; and generate one of the two or more best candidate words based a plurality of segments that correspond to the plurality of partial distances.

15. The method of claim 10, where generating the second extrinsic information further includes:

identifying a portion of the candidate words that include a first bit that is inverted relative to a first bit associated with a best word of the two or more best words;

selecting, as a second best word, one of the portion of the candidate words associated with a shortest distance between the word and the portion of the candidate words; and generating the second extrinsic information based on a difference between a distance associated with the best word and a distance associated with the second best word.

16. The method of claim 10, where the two or more best words include at least a best candidate word and a second best candidate word, the best candidate word being associated with a shortest distance that is less than:
a distance between the second best candidate word and the encoded word, and
other distances between other candidate words and the encoded word, and the second best candidate word being associated with a next shortest distance, the next shortest distance being less than the other distances.

17. The method of claim 10, the method further comprising:

performing, on a per segment basis, the forward error correction, on the word, in a manner that does not include storing, in a memory associated with the device, the updated first segment or the second segment,
the performing the error correction causing an increase in an amount of available memory space within the memory,
the increase in the amount of available memory enabling a greater quantity of errors to be corrected, by the device, than would have been corrected had the first segment or the second segment been stored within the memory.

18. A device comprising:

one or more components to:

receive a word, of a block of words within traffic, on which to perform a forward error correction operation, the word including a plurality of samples, each one of the plurality of samples including respective encoded bits and respective reliability bits, the respective reliability bits corresponding to a respective level of reliability of the respective encoded bits, obtain segments from the word, each of the segments including a respective subset of samples of the plurality of samples, modify, on a per segment basis, reliability levels associated with the word based on extrinsic information associated with a previously processed word, identify, on the per segment basis, sets of least reliable positions (LRPs) associated with the segments, each of the sets of LRPs corresponding to a respective portion, of each subset of samples, associated with lowest levels of reliability, create a subset of LRPs based on selected samples, of the respective portion of each of the subsets of samples, associated with one or more of the lowest levels of reliability, generate candidate words based on different combinations of inverted encoded bits, within the word, that correspond to the selected samples, decode the word and the candidate words to identify one or more errors within the word or the candidate words, update, using the extrinsic information, a segment of the word based on a determination that the segment includes an error of the one or more errors, create, on the per segment basis, an updated word, the updated word including the updated segment and other segments, of the word, associated with the modified reliability levels, determine, on the per segment basis, distances between the segments of the updated word and segments of selected candidate words, identify, as a best word, one of the selected candidate words associated with a shortest one of the distances, and perform the forward error correction, on a next word of the block of words, using the best word.

19. The device of claim 18, where, when modifying the reliability levels associated with the word, the one or more components are to:

obtain a first one of the segments, and generate a modified first segment based on a combination of the first one of the segments and the extrinsic information associated with a first segment of the previously processed word.

20. The device of claim 18, where, when identifying the sets of LRPs associated with the word, the one or more components are further to:

identify reliability values associated with a first subset of samples that corresponds to a modified first one of the segments, and select a samples, of the first subset of samples, that correspond to reliability values associated with at least one of the lowest levels of reliability.

21. The device of claim 18, where, when creating the subset of LRPs, the one or more components are further to:

identify first reliability values that correspond to first samples associated with a first set of LRPs, the first set of LRPs being associated with a modified first one of the segments, identify second reliability values that correspond to second samples associated with a second set of LRPs, the second set of LRPs being associated with a modified second one of the segments, sort the first samples and the second samples based on the first reliability values and the second reliability values to identify a portion of the first reliability values and the second reliability values that correspond to the one or more of the lowest levels of reliability, and select, as the subset of LRPs, a portion of the sorted first samples and second samples to which the portion of the first reliability values and the second reliability values correspond.

22. The device of claim 18, further comprising:
a memory to store the updated word or the segments, of the word, associated with the modified reliability levels; and
where, after generating candidate words, the one or more components are further to:
   discard, from the memory, all or a portion of the updated word or the segments associated with the modified reliability levels.

23. The device of claim 18, where, when determining the distances, the one or more components are further to:
   determine, for a first segment of a first candidate word, a first partial distance based on a combination of reliability values associated with the first segment of the first candidate word,
   determine, for a second segment of the first candidate word, a second partial distance based on a combination of reliability values associated with the second segment of the first candidate word,
   determine, for a first segment of the word, a third partial distance based on a combination of reliability values associated with the first segment of the word,
   determine, for a second segment of the word, a fourth partial distance based on a combination of reliability values associated with the second segment of the word, and
   identify a distance, associated with the first candidate word, based on a difference between a first sum of the first partial distance and the second partial difference, and a second sum of the third partial distance and the fourth partial distance.

24. The device of claim 23, where the one or more components are further to:
   determine that the first candidate word is the best word when the distance is less than other distances associated with other candidate words.

25. The device of claim 18, where, when updating the segment of the word, the one or more components are further to:
   obtain a first one of the segments of the word,
   determine whether the first one of the segments includes an encoded bit with which the error is associated, and
   modify, using the extrinsic information, a reliability level associated with the encoded bit when the first one of the segments includes the encoded bit with which the error is associated.

26. The device of claim 18, where the one or more components are further to:
   determine that a first candidate word includes an error, the error corresponding to an LRP within the subset of LRPs,
   identify the first candidate word as a duplicate candidate word based on the determination that a first candidate word includes the error that corresponds to the LRP,
   determine that second candidate word includes another error that does not correspond to any of the LRPs within the subset of LRPs,
   identify that the second candidate word is not correctable based on the determination that the second candidate word includes the other error that does not correspond to any of the LRPs, and
   select candidate words in a manner that does not include the first candidate word or the second candidate word.

* * * * *